US012706585B2

(12) United States Patent
Dupont et al.

(10) Patent No.: US 12,706,585 B2
(45) Date of Patent: Aug. 11, 2026

(54) BULK ACOUSTIC WAVE DEVICE AND METHOD OF MAKING SUCH A DEVICE

(71) Applicant: COMMISSARIAT A L'ENERGIE ATOMIQUE ET AUX ENERGIES ALTERNATIVES, Paris (FR)

(72) Inventors: Florian Dupont, Grenoble Cedex (FR); Guillaume Rodriguez, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 919 days.

(21) Appl. No.: 18/061,758

(22) Filed: Dec. 5, 2022

(65) Prior Publication Data

US 2023/0216474 A1 Jul. 6, 2023

(30) Foreign Application Priority Data

Dec. 6, 2021 (FR) ...................................... 21 13020

(51) Int. Cl.
*H03H 9/02* (2006.01)
*H03H 9/13* (2006.01)

(52) U.S. Cl.
CPC .... *H03H 9/02228* (2013.01); *H03H 9/02039* (2013.01); *H03H 9/131* (2013.01)

(58) Field of Classification Search
CPC ........... H03H 9/02228; H03H 9/02039; H03H 9/131; H03H 9/175
USPC ..... 310/313 R, 313 A, 313 B, 313 C, 313 D, 310/324
See application file for complete search history.

(56) References Cited

U.S. PATENT DOCUMENTS

2019/0273478 A1 9/2019 Lin et al.
2019/0273479 A1 9/2019 Caron et al.
2019/0273480 A1 9/2019 Lin et al.
2020/0412299 A1* 12/2020 Kurokawa ............. H03H 9/131
2021/0399712 A1* 12/2021 Daimon ............ H03H 9/02574
(Continued)

FOREIGN PATENT DOCUMENTS

CN 111769809 A 10/2020
WO WO 2018/004668 A2 1/2018
(Continued)

OTHER PUBLICATIONS

French Preliminary Search Report issued Aug. 16, 2022 in French Application 21 13020, filed on Dec. 6, 2021 (with English Translation of Categories of cited documents and Written Opinion), 10 pages.

(Continued)

*Primary Examiner* — Derek J Rosenau
(74) *Attorney, Agent, or Firm* — Oblon, McClelland, Maier & Neustadt, L.L.P.

(57) ABSTRACT

An electroacoustic device includes, stacked in a direction a silicon-based substrate, a first electrode, a piezoelectric layer with the basis of a perovskite taken from among lithium niobate $LiNbO_3$, lithium tantalum $LiTaO_3$, or an $Li(Nb,Ta)O_3$ alloy, on the first electrode, a second electrode disposed on the piezoelectric layer. Advantageously, the first electrode is made of a nitride-based electrically conductive refractory material, such as TiN, VN, TaN. The invention also relates to a method for producing such a device.

11 Claims, 4 Drawing Sheets

(56) References Cited

U.S. PATENT DOCUMENTS

2022/0014169 A1 1/2022 Caron et al.
2022/0014170 A1 1/2022 Lin et al.

FOREIGN PATENT DOCUMENTS

WO WO 2018/063358 A1 4/2018
WO WO 2018/111532 A1 6/2018

OTHER PUBLICATIONS

Lansiaux, X. et al. "$LiNb0_3$ thick films grown on sapphire by using a multistep sputtering process" Journal of Applied Physics. vol. 90, No. 10 (Nov. 15, 2001) 4 pages.
Bartasyte, A. et al. "Toward high-quality epitaxial $LINbO_3$ and $LiTaO_3$ thin films for acoustic and optical applications", Advanced Materials Interfaces, 2017, vol. 4, No. 8, p. 1600998. (36 pages).
Janski, R. et al. "Lithium barrier materials for on-chip Si-based microbatteries", Journal of Materials Science: Materials in Electronics, 2017, vol. 28, No. 19, p. 14605-14614. (10 pages).
Vispute, R.D. et al. "Epitaxial TiN based contacts for silicon devices", Journal of Electronic Materials, 1996, vol. 25, No. 11, p. 1740-1747. (1 page Abstract only).
Zivasatienraj, B. et al. "Epitaxy of $LiNbO_3$: Historical Challenges and Recent Success", Crystals, 2021, vol. 11, No. 4, p. 397. (13 pages).
https://akoustis.com/technology/xbaw/technology/ (3 pages).

* cited by examiner z
y x

BULK ACOUSTIC WAVE DEVICE AND METHOD OF MAKING SUCH A DEVICE

TECHNICAL FIELD

The present invention generally relates to a bulk acoustic wave, and more specifically, a method for producing the layer with the basis of a piezoelectric material forming the core of this device.

STATE OF THE ART

Resonators based on a so-called BAW (Bulk Acoustic Wave)-type structure are commonly used for producing RF filters. The core of BAW resonators is composed of a piezoelectric material which impacts the final properties of the filter.

Lithium niobate (LiNbO3) has been used for several years as piezoelectric material. Its intrinsic properties, likes its piezoelectric coupling coefficient, could make it possible for the filter to resonate at high frequency, for example at frequencies greater than 3.5 GHz, with a bandwidth which could go up to 600 MHz. To obtain a BAW filter having a high coupling coefficient, typically up to 50%, the LiNbO3-based piezoelectric layer must, in particular, have a high crystalline quality and a controlled stoichiometry.

The document, "A. Reinhardt et al., Acoustic filters based on thin single crystal LiNbO3 films: Status and prospects Proc.—IEEE Ultrason. Symp. 2014, 773" discloses a solution based on a transfer method known by the name Smart-Cut™ making it possible to manufacture a BAW filter comprising an LiNbO3-based piezoelectric layer on silicon substrate. A thin LiNbO3 layer is removed from a donor substrate, typically from a monocrystalline LiNbO3 substrate, then transferred to a receiver substrate, typically a silicon substrate. This solution implements numerous technical steps and has a significant cost.

Another solutions consists of synthetising the LiNbO3-based piezoelectric layer on the silicon substrate, by way of a buffer layer. The document, "Growth of highly near-c-axis oriented ferroelectric LiNbO3 thin films on Si with a ZnO buffer layer, P. You et al., Appl. Phys. Lett. 2013, 102, 051914" proposes to form a zinc oxide-based buffer layer, before forming the lithium niobate-based layer on this buffer layer. The thus synthetised LiNbO3-based piezoelectric layer however has a texturing. It is not monocrystalline. The ZnO-based buffer layer is not totally compatible either with an integration within a functional device, in particular with certain etching steps such as an etching of the lower electrode or an etching for the formation of the cavity under the ZnO. Adhesion problems are also observed.

There is therefore a need consisting of producing an electroacoustic device comprising a lithium niobate-based piezoelectric layer on a silicon-based substrate, which has an improved quality, while limiting the production costs.

An aim of the present invention is to at least partially meet this need.

Other aims, features and advantages of the present invention will appear upon examining the following description and the accompanying drawings. It is understood that other advantages can be incorporated.

SUMMARY

To achieve this aim, according to an embodiment, a method for producing an electroacoustic device comprising a piezoelectric layer is provided, said method comprising the following steps:

Providing a silicon-based substrate,

Forming a first electrode on the substrate,

Forming the piezoelectric layer on the first electrode,

Forming a second electrode on the piezoelectric layer.

Advantageously, the formation of the piezoelectric layer is done by epitaxy, on said first electrode, of a material of the ABO3 type, A being at least one first chemical element taken from among sodium (Na), potassium (K), barium (Ba), lithium (Li), lead (Pb), and B being at least one second chemical element taken from among zirconium (Zr), titanium (Ti), niobium (Nb), tantalum (Ta).

Advantageously, the first electrode is chosen, made of a nitride-based electrically conductive refractory material, such as TiN, VN, ZrN, TaN, HfN, NbN, or an alloy of said materials.

Preferably, the ABO3 material of the piezoelectric layer is taken from among lithium niobate LiNbO3, lithium tantalum LiTaO3, or an Li(Nb,Ta)O3 alloy.

In the scope of the development of the present invention, certain conditions for the epitaxial growth of the piezoelectric layer have been determined. The first electrode must preferably have at least some of the following properties:

Having a crystalline structure and/or a mesh parameter compatible with a silicon-based substrate. This makes it possible, for example, to subject the first electrode on the substrate to epitaxy.

Having a crystalline structure and/or a first mesh parameter close to or compatible with lithium niobate or lithium tantalum. This makes it possible to subject the piezoelectric layer on the first electrode to epitaxy, which thus forms a nucleation layer.

Having a thermal dilatation coefficient close to lithium niobate or lithium tantalum. This makes it possible to limit the appearance of cracks due to variations in temperatures during the formation of the piezoelectric layer.

Being electrically conductive.

Being able to block the diffusion of the Li atoms in Si. This makes it possible to avoid a loss of stoichiometry of a lithium niobate- or lithium tantalum-based piezoelectric layer, called LN/LT layer.

Confining an acoustic wave, in particular in view of guaranteeing high performances for electroacoustic devices.

A technical prejudice of the state of the art is that the nucleation layer must necessarily be oxide-based, in order to avoid a loss of stoichiometry of the LN/LT layer to due to a diffusion of oxygen from the LN/LT layer to the nucleation layer.

On the contrary, to meet these specifications, the first electrode forming the nucleation layer is chosen according to the present invention made of a nitride-based electrically conductive refractory material. This material is typically a transition refractory nitride with the basis of a transition metal, for example TiN, VN, ZrN, TaN, HfN, NbN, or their alloys. In the scope of the development of the present invention, it has indeed been observed that such a nucleation layer enables, fully unexpectedly, the epitaxy of the LN/LT layer under good conditions. Surprisingly, it has also been observed that such a nucleation layer makes it possible to block both the diffusion of oxygen and the diffusion of lithium to the silicon-based substrate. The result of this, is that the LN/LT layer subjected to epitaxy on such a nucleation layer preserves the required stoichiometry.

Moreover, the different crystalline structures and the mesh parameters of the transition refractory nitrides are fully compatible with those of the LN/LT materials and of silicon.

Such a nucleation layer can therefore advantageously be subjected to epitaxy on a silicon-based substrate, then enable the epitaxy of the LN/LT layer.

Moreover, transition refractory nitrides are conductive and can therefore be used as first electrode of a BAW filter. If these materials are subjected to epitaxy on silicon, they can have resistivity values of around 15 μOhm·cm, which is fully compatible with the manufacturing of a BAW filter.

Moreover, transition refractory nitrides are resistant to the growth conditions of LiNbO3, in particular, the high temperature required for the growth of LiNbO3, which can be around 1000° C.

Moreover, transition refractory nitrides are sufficiently hard to protect the surface of the silicon during the growth of LiNbO3. They protect, for example, the silicon of the plasma and from the impact of ions used in the implementation of a physical vapour deposition (PVD) technique for the growth of LiNbO3.

Transition refractory nitrides can also have interesting rigidity and acoustic impedance values to further confine acoustic waves in the piezoelectric layer.

The present invention thus proposes a solution making it possible to form an electroacoustic device on a silicon-based substrate—without transfer step—by way of the first electrode with the basis of a transition refractory nitride, playing the role of a nucleation layer. Thanks to such a nucleation layer made of a nitride-based electrically conductive refractory material, the LN/LT piezoelectric layer is stoichiometric and of high crystalline quality.

The piezoelectric layer thus has the properties required for a high-frequency BAW filter-type application.

According to another aspect of the invention, an electroacoustic device is provided, in particular a bulk acoustic wave (BAW) device, comprising, stacked in a vertical direction:

- a silicon-based substrate,
- a first electrode on said substrate,
- a piezoelectric layer on said first electrode, said piezoelectric layer being with the basis of an ABO3-type material, O being oxygen, A being at least one first chemical element taken from among sodium (Na), potassium (K), barium (Ba), lithium (Li), lead (Pb), and B being at least one second chemical element taken from among zirconium (Zr), titanium (Ti), niobium (Nb), tantalum (Ta),
- a second electrode disposed on the piezoelectric layer.

Advantageously, the first electrode of the BAW device is made of a nitride-based electrically conductive refractory material. Preferably, the piezoelectric layer is lithium niobate LiNbO3-, or lithium tantalum LiTaO3-based, or an Li(Nb,Ta)O3 alloy. The advantages mentioned above apply mutatis mutandis. Such a device is further directly integrable into silicon technology. It can be easily cointegrated with other microelectronic or optoelectronic devices, or also with (opto-) electromechanical microsystems (MEMS or MOEMS, (microelectromechanical systems and microoptoelectromechanical systems).

BRIEF DESCRIPTION OF THE FIGURES

The aims, objectives, as well as the features and advantages of the invention will best emerge from the detailed description of embodiments of the latter which are illustrated by the following accompanying drawings, wherein.

Figure 1:
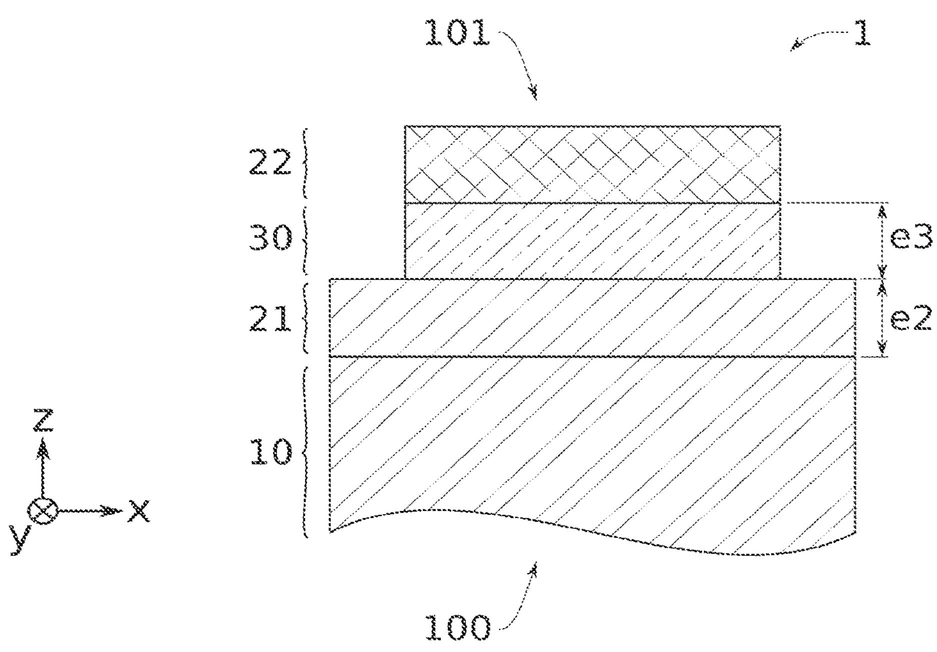
FIG. 1 illustrates, as a transverse cross-section, a BAW-type electroacoustic device according to an embodiment of the present invention.

The drawings are given as examples and are not limiting of the invention. They constitute principle schematic representations intended to facilitate the understanding of the invention and are not necessarily to the scale of practical applications. In particular, on the principle diagrams, the thicknesses of the different layers and portions, and the dimensions of the patterns are not representative of reality.

DETAILED DESCRIPTION

Before starting a detailed review of embodiments of the invention, optional features are stated below, which can optionally be used in association or alternatively:

According to an example, the nitride-based electrically conductive refractory material of the first electrode is chosen so as to have or to form:

- A resistance to oxidation,
- A barrier to the diffusion of lithium.

This makes it possible to avoid a diffusion of oxygen and of lithium from the LN/LT piezoelectric layer to the first electrode. The stoichiometry of the LN/LT layer is thus preserved.

According to an example, the nitride-based electrically conductive refractory material of the first electrode is chosen so as to have a hardness or a sufficiently high mechanical rigidity to make it possible to confine an acoustic wave in the LN/LT piezoelectric layer. For example, the Young's modulus of this material is greater than 300 GPa. Its hardness or resistance can be greater than 9000 MPa.

According to an example, the nitride-based electrically conductive refractory material of the first electrode is chosen so as to have a crystallographic structure compatible with the substrate and the LN/LT piezoelectric layer, such as a hexagonal or face-centred cubic structure. This makes it possible to limit the appearance of structural defects during the formation of the LN/LT layer by epitaxy.

According to an example, the formation of the first electrode is configured such that said first electrode has a thickness e2 of between 10 nm and 1000 nm, for example 100 nm. This makes it possible to obtain the desired crystalline quality and/or to limit the appearance of structural defects.

According to an example, the formation of the LN/LT piezoelectric layer is configured such that said LN/LT layer has, after epitaxy, a thickness e3 of between several hundreds of nanometres and several microns. Such a thickness e3 makes it possible to obtain the desired resonance frequency for the BAW filter.

According to an example, the nitride-based electrically conductive refractory material is taken from among transition refractory nitrides with the basis of a transition metal such as titanium nitride TiN, tantalum nitride TaN, niobium nitride NbN, zirconium nitride ZrN, hafnium nitride HfN, vanadium nitride VN, or their alloys.

According to an example, the nitride-based electrically conductive material of the first electrode is chosen from among a transition refractory nitride such as titanium nitride TiN, tantalum nitride TaN, niobium nitride NbN, zirconium nitride ZrN, hafnium nitride HfN, vanadium nitride VN, or their alloys.

According to an example, the electroacoustic device is a bulk acoustic wave filter of the suspended membrane type. According to an example, the method comprises, after formation by epitaxy of the piezoelectric layer, an etching of the silicon-based substrate under the first electrode carrying the piezoelectric layer, so as to form a cavity.

According to an example, the electroacoustic device is a bulk acoustic wave filter guided on a Bragg reflector. According to an example, the method comprises, before formation of the first electrode, a formation of a stack of layers, alternatively having high and low acoustic impedances.

According to an example, the low-impedance layers are TiN- or VN-based, and the high-impedance layers are HfN- or TaN-based.

According to an example, the formation of the first electrode and/or the formation of the LN/LT piezoelectric layer are achieved by pulsed laser deposition.

According to an example, the formation of the first electrode and the formation of the LN/LT piezoelectric layer are achieved by pulsed laser deposition successively within one same reactor without flushing with air between said formations. This makes it possible to avoid a step of cleaning the intermediate surface, to reduce the total duration of the method and to limit the costs. This also makes it possible to obtain a low surface roughness of the LN/LT layer.

According to an example, the substrate is silicon-based, oriented along (111), the first electrode is titanium nitride TiN-based oriented along (111), and the piezoelectric layer is oriented along (0001).

According to an example, the LN/LT piezoelectric layer is directly in contact with the first electrode. In particular, there is no oxide interlayer between the first electrode and the LN/LT layer.

According to an example, the nitride-based electrically conductive refractory material of the first electrode is a transition refractory nitride such as titanium nitride TiN, tantalum nitride TaN, niobium nitride NbN, zirconium nitride ZrN, hafnium nitride to HfN, vanadium nitride VN, or their alloys.

According to an example, the electroacoustic device is a bulk acoustic wave filter of the suspended membrane type, comprising a cavity under the first electrode carrying the piezoelectric layer.

According to an example, the electroacoustic device is a bulk acoustic wave filter guided on a Bragg reflector, comprising, between the substrate and the first electrode a stack of layers alternatively having high and low acoustic impedances.

According to an example, the first and second electrodes are contacted at a front face of the device.

According to an example, the first electrode is contacted at a rear face of the device, and the second electrode is contacted at a front face of the device.

According to an example, the silicon-based substrate is formed of a material taken from among: silicon, SiC, SiGe.

According to an example, the silicon-based substrate is monocrystalline.

According to an alternative example, the silicon-based substrate is polycrystalline.

According to an example, the silicon-based substrate is oriented along (111).

Unless incompatible, it is understood that all of the optional features above, can be combined so as to form an embodiment which is not necessarily illustrated or described. Such an embodiment is obviously not excluded from the invention. The features of an aspect of the invention, for example the device or the method, can be adapted mutatis mutandis to the other aspect of the invention.

It is specified that, in the scope of the present invention, the terms "on", "surmounts", "covers", "underlying", "opposite" and their equivalents do not necessarily mean "in contact with". Thus, for example, the deposition of a first layer on a second layer, does not compulsorily mean that the two layers are directly in contact with one another, but means that the first layer covers at least partially the second layer by being either directly in contact with it, or by being separated from it by at least one other layer or at least one other element.

A layer can moreover be composed of several sublayers of one same material or of different materials.

By a substrate, a stack, a layer, "with the basis" of a material A, this means a substrate, a stack, a layer comprising this material A only or this material A and optionally other materials, for example alloy elements and/or doping elements. Thus, a silicon-based substrate means, for example, an Si, doped Si, SiC, SiGe substrate. A TiN-based layer means, for example, a TiN, doped TiN layer, or TiN alloys.

By "selective etching vis-à-vis" or "etching having a selectivity vis-à-vis", this means an etching configured to remove a material A or a layer A vis-à-vis a material B or a layer B, and having an etching speed of the material A greater than the etching speed of the material B. The selectivity is the ratio between the etching speed of the material A and the etching speed of the material B.

By "electrically conductive", this means a material having a resistivity value less than 10000 μOhm·cm, preferably less than 300 μOhm·cm, and also preferably less than 100 μOhm·cm, in particular for an electrical conductor formed by a lower electrode.

Several embodiments of the invention implementing successive steps of the manufacturing method are described below. Unless explicitly mentioned, the adjective "successive" does not necessarily imply, even if this is generally preferred, that the steps immediately follow one another, intermediate steps being able to separate them.

Moreover, the term "step" means the carrying out of some of the method, and can mean a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single and inseparable actions over time and in the sequence of phases of the method.

A preferably orthonormal marker, comprising the axes x, y, z is represented in the accompanying figures. When one single marker is represented on one same set of figures, this marker applies to all the figures of this set.

In the present patent application, the thickness of a layer is taken in a direction normal to the main extension plane of the layer. Thus, a layer typically has a thickness along z. The relative terms "on", "surmounts", "under, "underlying", "inserted" refer to positions taken in the direction z.

The terms "vertical", "vertically" refer to a direction along z. The terms "horizontal", "horizontally", "lateral", "laterally" refer to a direction in the plane xy. Unless explicitly mentioned, the thickness, the height and the depth are measured along z.

An element located "in vertical alignment with" or "to the right of" another element means that these two elements are both located on one same line perpendicular to a plane wherein mainly extends a lower or upper face of a substrate, i.e. on one same line oriented vertically in the figures.

In the scope of the present invention, several BAW-type electroacoustic devices can be considered. These devices are, for example:

- the BAW-SMR ("solidly mounted resonator"), which typically comprises a stack of layers alternatively having high and low acoustic impedances, the assembly playing the role of a Bragg reflector;
- the BAW-HBAR ("high overtone bulk acoustic resonator"); it is the substrate itself which is the location of stationary waves, typically over several tens or hundreds of micrometres;
- the BAW-FBAR ("film bulk acoustic resonator"); it is a membrane, separated from the substrate by a vacuum zone, which resonates.

This list is not limiting. Other devices can be considered.

In the scope of the present invention, a transition refractory nitride is a nitride of a transition metal or transition element (element of which the atoms have an incomplete electronic sublayer d, or which can form cations of which the electronic sublayer d is incomplete). These elements are grouped together within the block d of the period table of elements.

In the examples described below, the LN/LT layer illustrated is lithium niobate LiNbO3-based. A lithium tantalum LiTaO3-based or a layer with the basis of an Li(Nb,Ta)O3-based layer can be substituted for this lithium niobate LiNbO3 layer in the scope of this invention. Thus, all the features and all the technical effects mentioned regarding LiNbO3 are fully applicable and combinable with an LiTaO3 or Li(Nb,Ta)O3 layer.

X-ray diffraction analyses, for example in 2θ configuration, or in rotation about cp and/or Ω (phi-scan and omega-scan), can be carried out so as to determine the crystalline quality of the LN/LT layers and of the electrodes or nucleation layers, and their epitaxy relationship.

FIG. 1 illustrates, as a transverse cross-section, a BAW-HBAR filter-type device 1, according to an embodiment of the invention. This device 1 typically comprises a silicon-based substrate 10 on which is formed a first titanium nitride TiN-based electrode 21. A lithium niobate LiNbO3 layer 30 is directly in contact with the first electrode 21. A second electrode 22 surmounts the LN/LT piezoelectric layer 30.

The use of a first electrically conductive refractory nitride-based electrode, in particular made of TiN, advantageously makes it possible to perform a heteroepitaxy of LiNbO3 on silicon substrate 10. This first electrode 21 can thus be assimilated to a nucleation layer. This solution makes it possible to produce high-performance BAW electroacoustic devices 1. The epitaxy makes it possible, in particular, to obtain a stoichiometric LiNbO3 layer, preferably oriented in one single crystalline orientation in all directions and of high crystalline quality. The thickness of this LiNbO3 layer obtained by epitaxy is further fully controlled. The LiNbO3 layer can be formed directly on substrates 10 of different sizes, without an intermediate transfer step. This advantageously makes it possible to decrease the manufacturing costs of a stack of layers 10, 21, 30. Such a method can be further directly integrated in a production factory at the CMOS technology standard (complementary N- and P-type MOS transistors—Metal/Oxide/Semiconductor).

The substrate 10 can be a so-called silicon bulk substrate. Alternatively, this substrate 10 can be an SOI (Silicon On Insulator)-type substrate. Other substrates 10 can be considered, for example SiC-based substrates. Such substrates have a total compatibility with silicon technologies for microelectronics. Silicon can also be thermally and/or electrically conductive. This makes it possible, for example, to release the heat generated in an operating BAW filter. This optionally makes it possible to contact the device by the rear face 100, in particular when the silicon is doped.

The first electrode or nucleation layer 21 is preferably with the basis of a transition refractory nitride. It preferably has a hexagonal crystallographic or face-centred cubic structure. Such a structure enables, in particular, an epitaxy of the nucleation layer on silicon oriented along (001) and (111). This also makes it possible to subject an LN/LT material to epitaxy in different crystalline orientations. Preferably, the silicon is oriented along (111). The nucleation layer 21 is, for example titanium nitride TiN-based. TiN is typically thermally and electrically conductive. TiN is further a rigid material making it possible to confine an acoustic wave in an upper LN/LT-type layer. TiN can be raw or deposited on silicon in a known manner. Vanadium nitride, zirconium nitride, tantalum nitride, hafnium nitride and niobium nitride have properties similar to those of titanium nitride. They can also be advantageously chosen as first electrode/nucleation layer 21. Below, due to its dual electrode and nucleation layer function, the first electrode 21 is called "nucleation electrode 21".

The nucleation electrode 21 can be formed by a physical or chemical deposition, for example preferably by pulsed laser deposition (PLD). It can be alternatively formed by one of the following techniques: chemical vapour deposition (CVD), preferably metal organic chemical vapour deposition (MOCVD), PVD (sputtering), plasma enhanced atomic layer deposition (PEALD).

It is preferably subjected to epitaxy on the substrate 10. This makes it possible to obtain a monocrystalline nucleation layer 21. According to another embodiment, the nucleation electrode 21 is polycrystalline with, for example, a preferably orientation. An orientation along a growth plane (111) can be typically chosen for a TiN nucleation electrode 21.

The nucleation electrode 21 formed on the substrate 10 is preferably stoichiometric. It has a thickness e2 of between 10 and 1000 nanometres, for example around 100 nm. The thickness e2 of the nucleation electrode 21 can be chosen according to the desired crystalline quality.

The LN/LT piezoelectric layer 30 is lithium niobate LiNbO3- or lithium tantalum LiTaO3-based, or also an Li(Ta,Nb)O3-type alloy. This layer 30 can be formed by a physical or chemical deposition technique, for example and preferably by pulsed laser deposition PLD. It can be alternatively formed by one of the following techniques: chemical vapour deposition (CVD), preferably metal organic chemical vapour deposition (MOCVD), PVD (sputtering), molecular beam epitaxy (MBE).

The LN/LT piezoelectric layer 30 is advantageously subjected to epitaxy on the nucleation electrode 21. It can be monocrystalline or polycrystalline, with, for example, a preferable orientation. An orientation along a growth plane (0001) can be typically chosen. This makes it possible to maximise the propagation speed of the acoustic waves within the LN/LT layer 30. Other orientations can be chosen according to the desired application.

The LN/LT layer 30 formed on the nucleation electrode 21 is preferably stoichiometric, for example $Li_1Nb_1O_3$. The atomic percentage of lithium is ideally close to 50%. The LN/LT layer 30 has a thickness e3 of between 50 nanometres and a few hundreds of nanometres or a few microns, for example of around 500 nm. The thickness e3 of the LN/LT layer 30 can be chosen according to the desired resonance frequency.

According to a possibility, the nucleation electrode 21 and the LN/LT layer 30 are both produced in situ by PLD in one same growth reactor. The growth of the LN/LT layer 30 can thus be achieved directly after the end of growth of the nucleation electrode 21. This makes it possible to avoid a flushing with air of the nucleation electrode 21 before epitaxy of the LN/LT layer 30. The surface of the nucleation electrode 21 is therefore not contaminated, nor polluted, nor oxidised. This avoids an intermediate cleaning step. The duration of the method is thus decreased. This makes it possible also to limit the appearance of roughness during the formation of the LN/LT layer 30. The state of the interface between the LN/LT layer 30 and the nucleation electrode 21 is therefore not modified and the surface of the LN/LT layer 30 is thus optimised.

The second electrode 22 is typically with the basis of an electrically conductive material. According to a possibility, this electrode material can also have a high acoustic impedance. Platinum, aluminium or molybdenum can be chosen as electrode material. The second electrode 22 can be structured so as to have electrode patterns. Such an electrode 22 is typically formed by lithography/etching from an electrically conductive layer deposited on the LN/LT layer 30. In the electroacoustic devices 1 according to the present invention, the piezoelectric layer 30 is sandwiched between the first and second electrodes 21, 22, in the vertical direction z. The piezoelectric layer 30 is preferably directly in contact with the first and second electrodes 21, 22.

Figure 2:
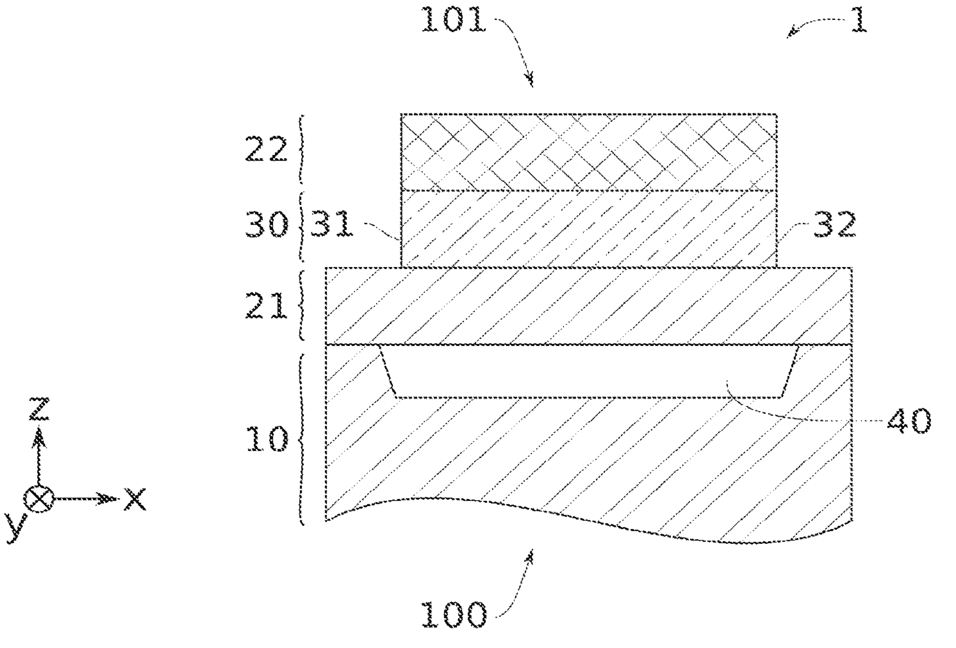
FIG. 2 illustrates, as a transverse cross-section, a BAW-FBAR-type electroacoustic device according to an embodiment of the present invention.

FIG. 2 illustrates another embodiment of the device 1. In this example, the device 1 is an FBAR-type BAW filter. The features of the different elements described above in the case of the BAW-HBAR (substrate, nucleation electrode, piezoelectric layer, second electrode) are also valid in the embodiments below, mutatis mutandis. In addition to the elements described above, the BAW-FBAR comprises a cavity 40 formed in the substrate 10, under the piezoelectric layer 30 and the nucleation electrode 21.

This cavity 40 can be formed by etching the substrate 10 through an opening of the nucleation electrode 21. Advantageously, in the case of a silicon substrate and of a nucleation electrode 21 made of TiN, the etching selectivity $S_{Si}$:$S_{TiN}$ between Si and TiN is sufficiently high, typically greater than 5:1, such that the nucleation electrode 21 is not damaged during the etching of silicon. The etching of silicon can be done by wet etching with the basis of a diluted ammoniac solution NH4OH or tetramethylammonium hydroxide (TMAH). The nucleation electrode 21 subsequently forms, with the piezoelectric layer 30, a membrane suspended above the cavity 40.

The cavity 40 is preferably formed in vertical alignment with the piezoelectric layer 30. It can extend on either side of the edges 31, 32 of the piezoelectric layer 30, projecting in the plane xy.

Figure 3A:
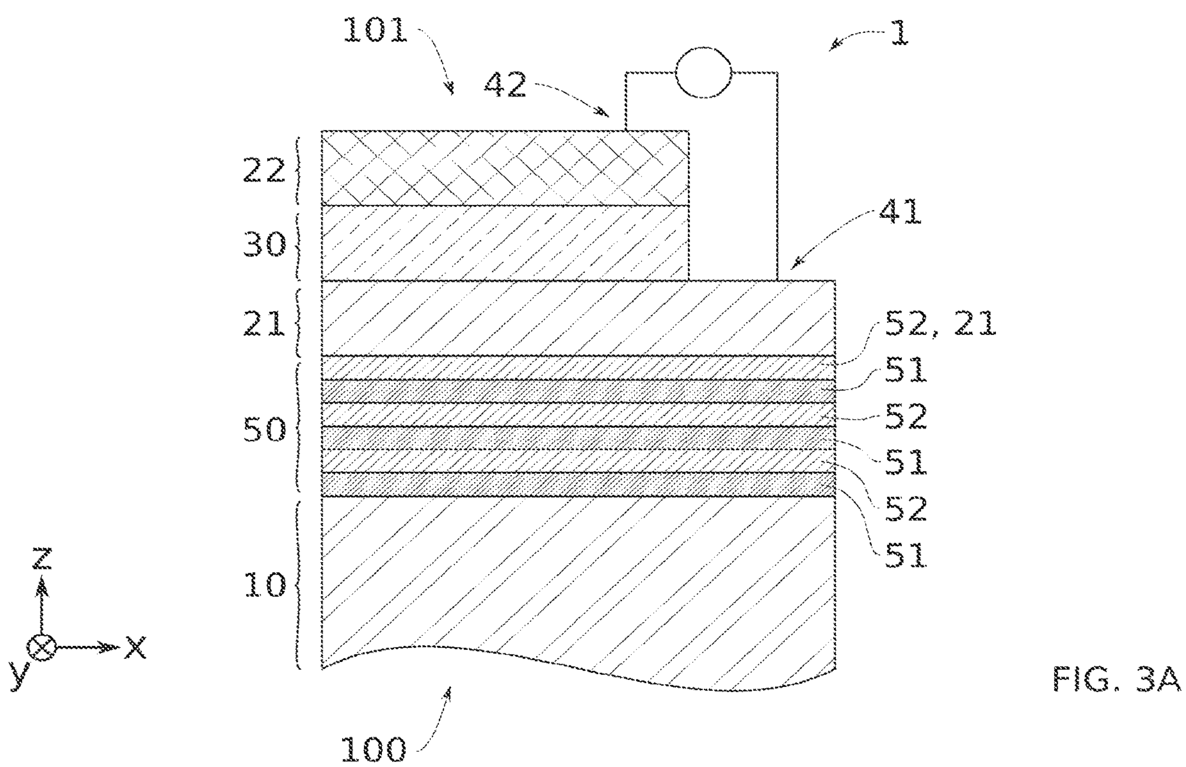
FIG. 3A illustrates, as a transverse cross-section, a BAW-SMR-type electroacoustic device according to an embodiment of the present invention.
Figure 3B:
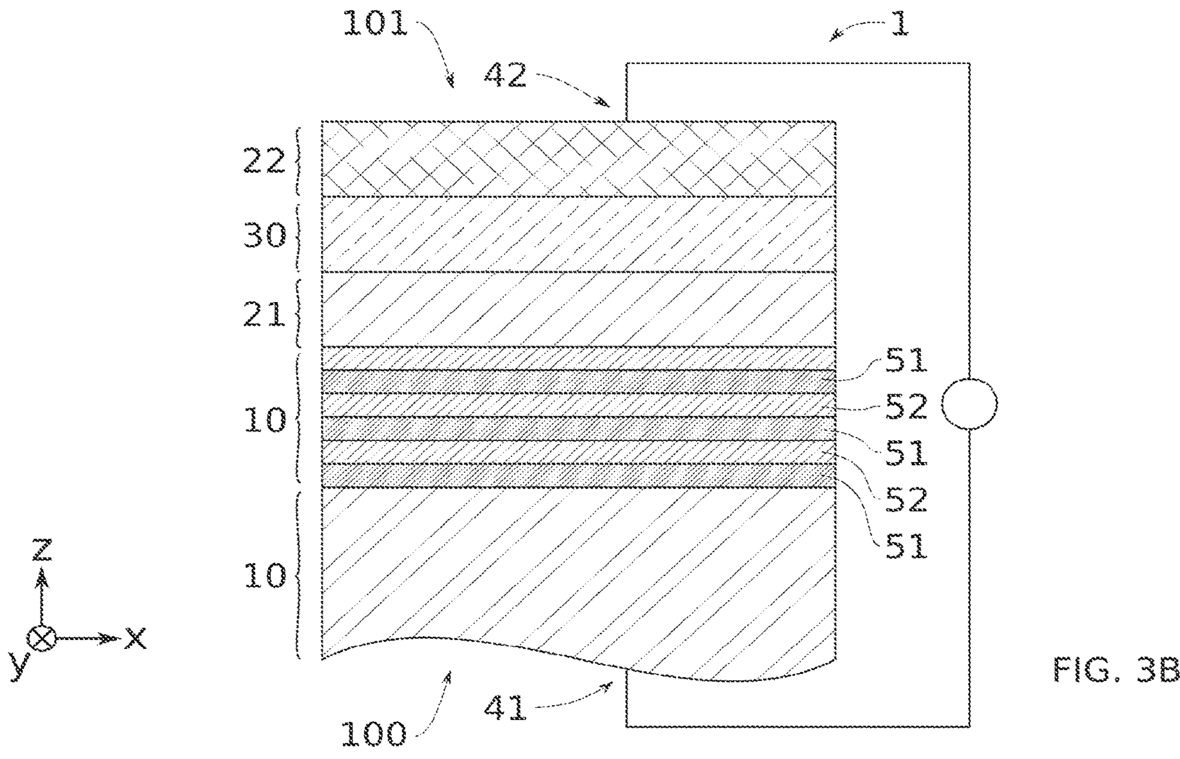
FIG. 3B illustrates, as a transverse cross-section, a BAW-SMR-type electroacoustic device according to another embodiment of the present invention.

FIGS. 3A, 3B illustrate different embodiments of a BAW-SMR-type device 1. In these devices, in addition to the BAW-HBAR elements, a stack 50 of layers 51, 52 forming an "acoustic" Bragg reflector is inserted between the substrate 10 and the nucleation electrode 21.

This stack 50 is preferably subjected to epitaxy on the substrate 10. It preferably has an electric conduction through the assembly of the layers 51, 52. In the embodiment illustrated in FIG. 3A, the electric contacts 41, 42 are made on one same side of the device 1, typically on the front face 101, directly on the first and second electrodes 21, 22. In the embodiment illustrated in FIG. 3B, the electric contacts 41, 42 are made on two opposite sides of the device 1, typically on the front face 101 on the electrode 22 and on the rear face 100 of the substrate 10. The first electrode 21 is thus indirectly contacted via the substrate 10 and the stack 50. This makes it possible to avoid a re-contact on the front face for the first electrode 2, which is located under the piezoelectric layer 30. The number of steps of the method is thus reduced. This advantageously makes it possible to increase the utilisable surface of the piezoelectric layer 30 on the front face, in the plane xy.

The layers 51, 52 are respectively high acoustic impedance and low acoustic impedance layers, relative to one another. Typically, a factor greater than 2 and preferably greater than 3 will be chosen, between the high acoustic impedance and low acoustic impedance values (MRayl units). Advantageously, the layers 51, 52 can be electrically conductive. The high acoustic impedance layers can be made of HfN or made of TaN, for example. The low acoustic impedance layers can be made of TiN or made of VN, for example. The last layer 52 of the stack 50 under the piezoelectric layer 30, for example made of TiN, can advantageously form the nucleation electrode 21. This also reduces the number of steps necessary for the manufacture of the BAW-SMR.

FIGS. 4A to 4E illustrate steps of a method for manufacturing a BAW-FBAR, according to an embodiment of the invention.

Figure 4A:
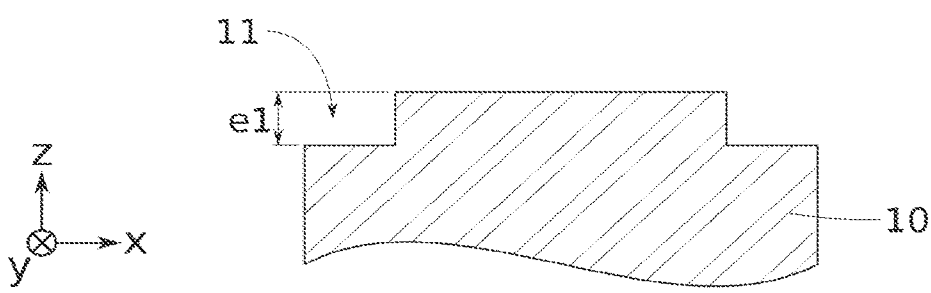
FIGS. 4A to 4E illustrate steps of a method for manufacturing a BAW-FBAR-type electroacoustic device according to an embodiment of the present invention.

As illustrated in FIG. 4A, prior to the formation of the nucleation electrode 21, the silicon substrate 10 can be structured so as to form a mesa structure of height e1, bordered by at least one removal of material 11. The height e1 of the mesa structure can be from around a few hundreds of nanometres to a few microns, for example around 500 nm. This structuring is done typically by conventional lithography/etching.

Figure 4B:
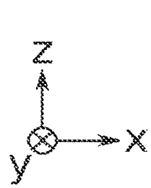
Figure 4B:
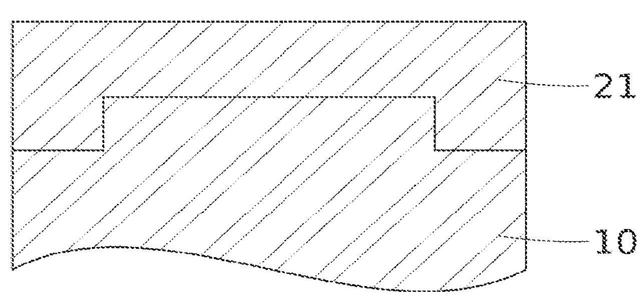

As illustrated in FIG. 4B, the nucleation electrode 21 is formed, preferably by epitaxy, on and around the mesa structure. A flattening step, typically by chemical mechanical polishing CMP, can then be carried out.

Figure 4C:
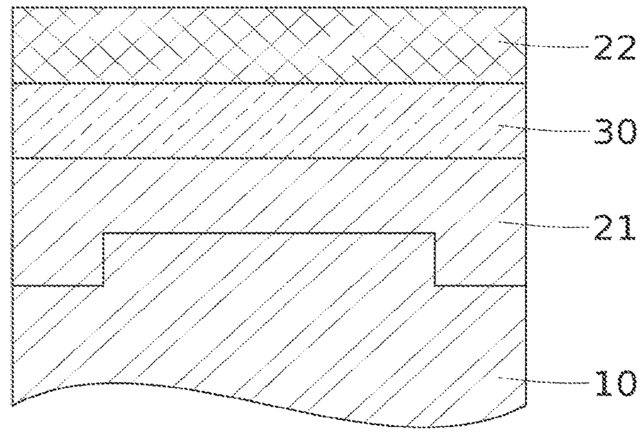
Figure 4C:
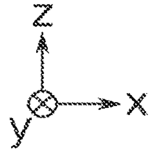

As illustrated in FIG. 4C, the piezoelectric layer 30 is then subjected to epitaxy on the nucleation electrode 21, then the second electrode 22 is formed, for example by PVD, on the piezoelectric layer 30.

Figure 4D:
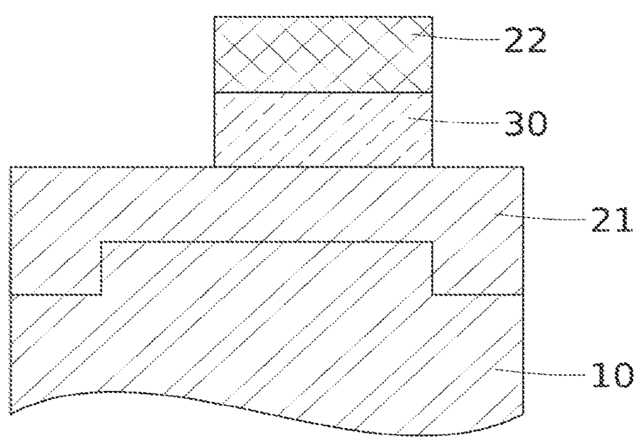
Figure 4D:

As illustrated in FIG. 4D, the stack of layers 30, 22 is structured by lithography/etching so as to have a lateral dimension I2 less than the lateral dimension I1 of the underlying mesa structure. Advantageously, the nucleation electrode 21 has a resistance to etching which is sufficient to obtain a good control of stopping etching during this first etching, on the surface of the nucleation electrode 21. According to an embodiment, when the nucleation electrode 21 is made of TiN, it forms a stop layer for the etching.

Figure 4E:
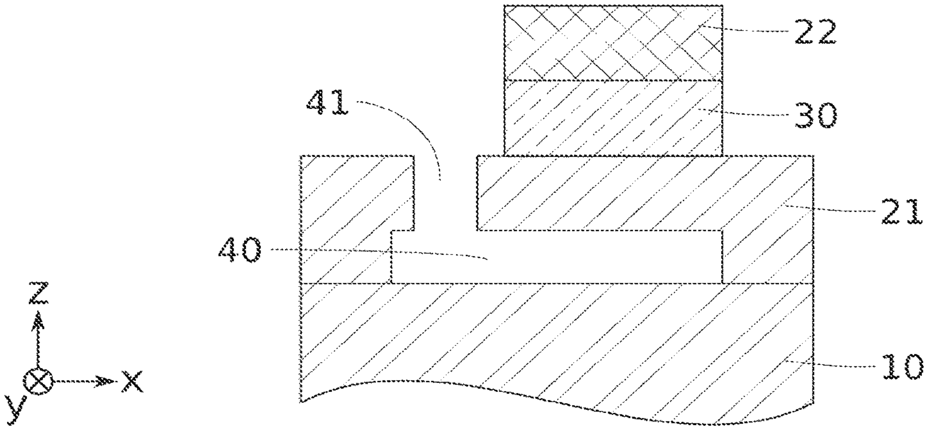

As illustrated in FIG. 4E, a second etching can be performed to form at least one opening 41 in the nucleation electrode 21, for example, at the edge of the stack of the layers 30, 22. The layers 30, 22 are typically protected by the resin mask encapsulating the layers 30, 22, during the opening of the nucleation electrode 21. A third etching then makes it possible to form the cavity 40 under the stack of the layers 30, 22, 21. In particular, the mesa structure of the silicon substrate is removed through the opening 41 during this third etching. It is not necessary to reclose the cavity 40. The opening 41 in the layer 21 is not necessarily filled or resealed.

Preferably, the first etching makes it possible to etch the piezoelectric layer 30 selectively vis-à-vis the nucleation electrode 21. The third etching makes it possible to etch the substrate 10 selectively vis-à-vis the nucleation electrode 21. An FBAR-type BAW device 1 is thus advantageously obtained. The present invention advantageously makes it possible to form electroacoustic devices comprising an LN/LT piezoelectric layer of good crystalline quality on silicon-based substrates, by way of a nucleation electrode made of a nitride-based electrically conductive refractory material, typically transition nitride-based. These BAW electroacoustic devices are advantageously directly integrable or co-integrable into silicon technology. Other applications can be considered. The invention is not limited to the embodiments described above.

The invention claimed is:

1. A method for producing an electroacoustic device comprising a piezoelectric layer, said electroacoustic device being a bulk acoustic wave filter guided on a Bragg reflector, said method comprising:

providing a silicon-based substrate, forming a first electrode on the substrate, forming the piezoelectric layer on the first electrode, and forming a second electrode on the piezoelectric layer, wherein the first electrode is made of a nitride-based electrically conductive refractory material, and wherein the formation of the piezoelectric layer is done by epitaxy, on said first electrode, of an ABO3-type material, O being oxygen, A being at least one first chemical element taken from among sodium (Na), potassium (K), barium (Ba), lithium (Li), lead (Pb), and B being at least one second chemical element taken from among zirconium (Zr), titanium (Ti), niobium (Nb), tantalum (Ta), said method further comprising, before formation of the first electrode, forming a stack of layers alternatively having high and low acoustic impedances, the low impedance layers being TiN- or VN-based, and the high impedance layers being HfN-or TaN-based.

2. The method according to claim 1, wherein the nitride-based electrically conductive refractory material is taken from among transition refractory nitrides with a basis of a transition metal.

3. The method according to claim 2, wherein the nitride-based electrically conductive refractory material is taken from among TiN, VN, ZrN, TaN, HfN, NbN, or their alloys.

4. The method according to claim 1, wherein the electroacoustic device is a bulk acoustic wave filter of the suspended membrane type, said method further comprising, after formation by epitaxy of the piezoelectric layer, an etching of the silicon-based substrate under the first electrode carrying the piezoelectric layer, so as to form a cavity.

5. The method according to claim 1, wherein the formation of the first electrode and the formation of the piezoelectric layer are achieved by pulsed laser deposition successively within one same reactor without venting with air between said formations.

6. The method according to claim 1, wherein the substrate is silicon-based, oriented along (111), the first electrode is titanium nitride TiN-based oriented along (111), and the piezoelectric layer is oriented along (0001).

7. An electroacoustic device comprising, stacked in a vertical direction, a silicon-based substrate, a first electrode on said substrate, a piezoelectric layer epitaxially grown on said first electrode, said piezoelectric layer being with the basis of an ABO3-type material, O being oxygen, A being at least one first chemical element taken from among sodium (Na), potassium (K), barium (Ba), lithium (Li), lead (Pb), and B being at least one second chemical element taken from among zirconium (Zr), titanium (Ti), niobium (Nb), tantalum (Ta), a second electrode disposed on the piezoelectric layer, wherein the first electrode is made of a nitride-based electrically conductive refractory material, and said electroacoustic device is a bulk acoustic wave filter guided on a Bragg reflector, comprising, between the substrate and the first electrode, a stack of layers alternatively having high and low acoustic impedances, the low impedance layers being TiN-or VN-based, and the high impedance layers being HfN- or TaN-based.

8. The device according to claim 7, wherein the nitride-based electrically conductive refractory material is taken from among transition refractory nitrides with the basis of a transition metal, for example TiN, VN, ZrN, TaN, HfN, NbN, or their alloys.

9. The device according to claim 7, wherein the electroacoustic device is a bulk acoustic wave filter of the suspended membrane type, comprising a cavity under the first electrode carrying the piezoelectric layer.

10. The device according to claim 7, wherein the first and second electrodes are in contact with a front face of the device.

11. The device according to claim 7, wherein the first electrode is contacted at a rear face of the device, and wherein the second electrode is in contact with a front face of the device.

* * * * *